United States Patent [19]

Lersmacher et al.

[11] 4,034,031
[45] July 5, 1977

[54] METHOD OF MANUFACTURING GRID ELECTRODES FOR ELECTRON TUBES

[75] Inventors: Bernhard Lersmacher, Aachen; Horst Seifert, Hamburg, both of Germany; Johannes Wilhelmus Antonius Krol, Eindhoven, Netherlands

[73] Assignee: U.S. Philips Corporation, New York, N.Y.

[22] Filed: Oct. 16, 1975

[21] Appl. No.: 622,999

[30] Foreign Application Priority Data

Oct. 23, 1974 Germany ............................ 2450261

[52] U.S. Cl. ............................... 264/25; 29/25.1; 219/121 EM; 264/29.1; 264/29.7; 264/39; 264/81; 264/105; 264/156; 331/94.5 R
[51] Int. Cl.² ...................... B29C 17/08; B23K 9/00
[58] Field of Search ................. 264/29, 22, 81, 39, 264/104, 105, 131, 154, 156, 29.1, 29.7, 25, 26; 331/94.5; 219/121 LM; 29/25.1

[56] References Cited

UNITED STATES PATENTS

| | | | |
|---|---|---|---|
| 3,138,435 | 6/1964 | Diefendorf | 264/81 |
| 3,265,519 | 8/1966 | Diefendorf | 264/29 |
| 3,351,690 | 11/1967 | Stover | 264/81 |
| 3,360,398 | 12/1967 | Garibotti | 219/121 LM |
| 3,367,826 | 2/1968 | Heestand et al. | 264/81 |
| 3,462,522 | 8/1969 | Clark et al. | 264/39 |

FOREIGN PATENTS OR APPLICATIONS

| | | | |
|---|---|---|---|
| 1,667,649 | 4/1972 | Germany | 264/81 |
| 1,667,650 | 3/1972 | Germany | 264/81 |
| 1,194,988 | 3/1963 | Germany | 264/81 |
| 956,342 | 4/1964 | United Kingdom | 264/81 |

OTHER PUBLICATIONS

"Effect of Substrate Structure on Deposition of Evaporated Carbon", Journal of Materials Science 3(1968), Letters pp. 559–561.

*Primary Examiner*—Jeffery R. Thurlow
*Attorney, Agent, or Firm*—Frank R. Trifari

[57] ABSTRACT

Method of manufacturing grid electrodes wherein a grid sleeve is produced by depositing pyrolytic graphite on a polished mandril of glassy carbon and provided with apertures by means of the laser beam, then the finished grid is provided, by means of hot gas pyrolysis, with a second layer of highly oriented pyrolytic graphite, and thermally and/or mechanically after-treated at 3000° to 3800° K and 10–500 bar.

8 Claims, No Drawings

METHOD OF MANUFACTURING GRID ELECTRODES FOR ELECTRON TUBES

The invention relates to a method of manufacturing grid electrodes for electron tubes, in which pyrolytic graphite is deposited on a mandril by thermal decomposition of carbon-containing gases and the resulting molded body is separated from the mandril and provided with grid-like apertures.

Graphite is already used on a large scale as a material in the construction of gas-filled and high-vacuum tubes and electron tubes, respectively. Decisive of the application in this special field are preferably the properties with respect to the high temperature, for example, the high sublimation point and melting point, respectively (approximately 4200°K at 105 bar), the comparatively low vapor pressure, the high thermal shock resistivity and the good thermal conductivity at high temperature. As regards the mechanical values, for the use in tubes (for example, rectifier tubes, electron tubes), the strength increasing when the temperature increases is of particular importance, of which strength the value increases in the range around 2500°K to approximately double its value at 300°K. Of the electronic values is of particular importance the comparatively high work function of approximately 4eV. This means that the thermal grid emission, but also the secondary electron emission, are low.

Known are also grid electrodes of graphite which are covered with pyrolytic carbon layers as well as metal grid electrodes coated with pyro-carbon. German Auslegeschrift 1,194,988 discloses electrodes which consist of pure pyrolytic graphite and which, compared with the normal grid electrode or graphite have the particular advantages which are related to the anisotropic structure of the pyrolytic graphite. Of particular importance are the comparatively much better mechanical stability and the associated larger reliability during operation, the possibility of manufacturing grids having much finer meshes, the better heat dissipation to the grid supports due to the very good thermal conductivity parallel to the lining layer of pyrolytic graphite, and the attainment of a better vacuum due to the absence of pores (well oriented pyrolytic graphite has almost the theoretical density of 2.26 gcm$^{-3}$ of the ideal graphite single crystal.

U.S. Pat. No. 3,462,522 describes that the surface state of the mandril on which the pyrolitic graphite is deposited is also decisive of the structure of the resulting molded body. In order to improve the surface state, according to said U.S. patent a mandril of electrographite is first treated with oxygen and then covered with a thin layer of pyrolytic graphite — a comparatively cumbersome and expensive process.

From British Patent Specification No. 956.342 it is known to connect several plates of pyrolytic graphite together by depositing pyrolytic graphite in the intermediate spaces between the plates. On the other hand it is known from J. Materials Sci. 3 (1968), 559–561 that the coating of pyrolytic graphite with pyrolytic graphite is not without problems and, for example, fails on (crystallographic) c-faces.

At any rate it cannot be derived from the above-mentioned publications that the manufacture of the pyrolytic graphite according to the hot gas pyrolysis method described in German Auslegeschrift No. 1,667,649 and German Auslegeschrift No. 1,667,650 has taken place.

It is the object of the invention to provide a method of manufacturing grid electrodes for electron tubes of the kind mentioned in the first paragraph, with which grid electrodes having improved mechanical and electrical properties are obtained and the reject percentages during the manufacture are also reduced.

According to the invention this is achieved in that the molded body, after the formation of the grid, is covered again with a thin layer of pyrolytic graphite and that the deposition on the mandril and the covering again of the molded body having grid-like apertures are carried out so that the temperature of the carbon-containing gas is higher, preferably at least 100°K higher, than the temperature of the mandril and the molded body, respectively.

During the investigations which have led to the invention it has been found that the method according to German Auslegeschrift No. 1,667,649 and German Patent Specification No. 1,667,650 is very suitable for the manufacture of comparatively thin-walled hollow bodies of pyrolytic graphite to which the invention mainly relates. This is proved by the very fact that the temperature differences occurring in the hot gas pyrolysis in the total deposition system, are maximum approximately 100°K. In addition, in the hot gas pyrolysis a delayed cooling of the deposition temperature to the ambient temperature necessarily occurs, in accordance with the thermal inertia of the deposition system. The two above factors have a very favourable influence on the reduction of internal stresses in the deposited body of pyrographite.

The following method was used for the manufacture of hollow bodies (sleeves) of pyrolytic graphite for use in various types of electron tubes: as a substrate for the sleeves, normal synthetic fine granular graphite was machined to a shape corresponding to the sleeve by turning, grinding and polishing. The pyrolytic graphite was deposited from propane ($C_3H_8$) at 2300° K an at a pressure of approximately 2 millibar. The deposition rate with these parameters was approximately 0.5 to 1.0 $\mu$m/min which means that for a sleeve having a wall thickness of 100 $\mu$m the duration of the deposition process is approximately 2 to 3 hours. Said low deposition rate is of advantage when it is desired that the deposition occur as homogeneously as possible, and the sleeve wall be free from larger carbon particles (clusters). A perfect structure of the pyrolytic graphite layer, that is a structure which is as homogeneous as possible, is of decisive significance for the subsequent faultless operation of the grid electrode.

In order to manufacture the required electrode shape, namely a grid, from the pyrographite sleeves, said sleeves should be further processed, to form a grid structure, by suitable processes, such as electro-erosion, cutting with an electron beam or the so-called "Electro-Chemical Machining" (ECM) and preferred is the cutting by means of laser beams. For the choice of the suitable cutting and working method, respectively, is decisive the desired "fineness" of the grid. Another important parameter is the wall thickness of the sleeve. In accordance with the circumstances, various methods may be used, including, of course, also purely mechanical processes (cutting, grinding), if desired in the case of a coarse-mesh grid structure.

By means of $CO_2$ lasers and solid-state lasers, grids of pyrolytic graphite were manufactured the cylindrical part of which was provided with approximately 2×180 "windows" having a width of approximately 200 $\mu$m and a height of 0.7 cm. The width of the part remaining between two windows is approximately 100 μm. With a wall thickness of 100 μm a cross-section of the part remaining between each two windows of $10^4$ μm$^2$ = $10^{-4}$ cm$^2$, is obtained.

As proved by records made in the REM (scanning electron microscope), the layers of the highly oriented pyrolytic graphite are incised during the cutting the sleeves. As a result of this, unfavourable surfaces from a vacuum and mechanical point of view are obtained. The former disadvantage is due to the tendency to degassing — also, however, due to an increased gettering power for alien gases — while the latter is due to the possiblity that the crumbling away of small graphite particles is increased and pressure loads as a result of temperature variations during operation may result in delamination of the laminated pyrographite. Electrically, an unfavourable side effect occurs by electron-emissive sides and/or tops and hence a reduced voltage stability (high breakdown voltage of the tube).

As a result of the manufacturing step according to the invention, in which the grid electrodes of pyrolytic graphite according to the above-described methods are coated again, after the cutting operation in making the mesh grid, with a thin, preferably 1–100 μm thick of pyrolytic graphite, it is achieved that the increased incised "unfavourable" surfaces are covered. As a result of this action, both the mechanical and the electrical properties as well as the vacuum properties, are improved. For example, delamination is prevented by covering the grid rods with a second layer of substantially impermeable pyrolytic graphite. Secondarily, as a result of the high temperatures applied upon the second covering to reach a temperature in the range of approximately 2300° K in a high vacuum, alien substances ($O_2$, $N_2$, impurities introduced upon cutting, for example, in air) are driven out (evaporated) and made inoperative, respectively. A further advantage of the second coating is that when the layer thickness increases the width of the grid apertures and the grid intermediate spaced, respectively, can be reduced to minimum dimensions which is of very great importance for use in the UHF range.

It is known that in addition to the parameters important for the homogeneity of a pyrolytic carbon layer: sustrate temperature, kind of pyrolysis gas (for example $CH_4$, $C_2H_6$, $C_3H_8$ and homologues, $C_2H_4$, $C_3H_6$ and homologues, $C_2H_2$ and homologues, $C_6H_6$ and similar aromates) and pyrolysis gas pressure, the state of the substrate, in particular of the surface thereof, is decisive to a high extent of the homogeneity and the degree of orientation of the deposited layer. In literature, these phenomena are described as "coarse-grained" or "fine-grained" substrate nucleated" pyrolytic graphite. A detailed summary of the phenomenology of the pyrolytic graphite is to be found in E. R. Stover, General Electric Company Report No. 62-RL-2991 M.

According to the invention, the homogeneity in the form of the suppression of a so-called secondary anisotropy can be improved in that the substrate which consists of electrographite, high-melting-point metal, for example molybdenum, tungsten, or tantalum, metal carbides, for example WC, MoC, TaC or NbC, preferably, however, of vitreous carbon, is polished as thoroughly as possible. It has been found that such polished substrates can very readily be deformed (that is to say that the deposited pyrographite sleeves can be easily removed after cooling) and that the total surface of the sleeves both on the inside and on the outside becomes very smooth to high glossy. The latter property is very important in particular for the high voltage breakdown resistance of a tube (no breakdowns).

For the operation of high frequency tubes, the question of the conductivity of the electrode materials with increasing frequency becomes ever more critical because the mechanism of the current conductivity occurs to an increasing extent in the surface region of the relevant conductor (skin-effect). Within the scope of the method according to the invention, it is efficacious to considerably improve the anisotropy of so-called "as deposited" pyrolytic graphite by an after-treatment at high temperature of 3000° to 3800° K, in particular at 3500° K. Said thermal after-treatment may be carried out under an inert gas at a pressure of 10–500 bar, in particular of 100 bar.

Such an after-treatment is carried out so that, for example, the deposited pyrolytic graphite is heated in an inert gas, for example, rare gases, of 300 bar to 3300° K for approximately one hour; the pressure is then reduced to approximately 10 bar and the temperature is increased for another 10 minutes to 3800° to 3900° K.

As a result of the thermal or thermal mechanical after-treatment according to the invention, conductivity values can be obtained which are in the order of magnitude of those of graphite intercalation compounds with approximately 2 to 3 · $10^5$ ohm$^{-1}$ cm$^{-1}$. Hence one enters the region of a good metallic conductivity (conductivity of copper approximately 5 · 8 · $10^5$ ohm$^{-1}$ cm$^{-1}$).

Summarizing, the most characteristic features of the method according to the invention and the preferred embodiments thereof are hence as follows:

a. Manufacture of a hollow body (grid sleeve) of pyrolytic graphite according to the hot gas pyrolysis method;

b. coating again the finished grid with a second layer of highly oriented pyrolytic graphite by means of hot gas pyrolysis;

c. preferably using (polished) substrate cores which are as smooth as possible. Preferably vitreous carbon is used because the best results are obtained therewith. Substrates were also investigated of polished tantalum and tungsten. They also give good results but always have to be polished again when they are used again;

d. preferably after-treatmeht of the electrode sleeves at high temperatures (3000° to 3800° K), separately or combined with the simultaneous use of high pressures, for example in a high pressure autoclave in an inert gas under isostatic pressure conditions: pressures in the order of magnitude of $10^2$ bar are to be preferred;

e. as a cutting method for the further processing of the grid sleeve to the grid electrode is preferably used the cutting by means of laser beams.

What is claimed is:

1. A method of manufacturing grid electrodes for electron tubes, in which pyrolytic graphite is deposited by thermal decomposition of carbon-containing gases on a mandril having a smooth surface and the resulting molded body is separated from the mandril and provided with grid-like apertures, characterized in that the molded body after the formation of the grid is covered again with a thin layer of pyrolytic graphite and that the steps of deposition on the mandril and the covering again of the molded body having grid-like apertures are carried out at a temperature of the carbon-containing gas that is higher than the temperature of the mandril and of the molded body, respectively.

2. A method as claimed in claim 1, characterized in that the temperature of the carbon-containing gas is at least 100° K higher than the temperature of the mandril and of the molded body, respectively.

3. A method as claimed in claim 2, characterized in that before depositing the pyrolytic graphite the mandril is polished.

4. A method as claimed in claim 3, characterized in that a mandril of glassy carbon is used.

5. A method as claimed in claim 4, characterized in that the molded body after the formation of the grid is covered with a layer of pyrolytic graphite which is from 1 to 100 μm thick.

6. A method as claimed in claim 5, characterized in that the grid electrodes are subjected to a thermal after-treatment at 3000° to 3800° K.

7. A method as claimed in claim 6, characterized in that the thermal after-treatment is carried out under an inert gas at a pressure of 10 to 500 bar.

8. A method as claimed in claim 7, characterized in that the molded body is provided with grid-like apertures by means of laser beams.

* * * * *